(12) United States Patent
Gunji et al.

(10) Patent No.: US 7,271,385 B2
(45) Date of Patent: Sep. 18, 2007

(54) INSPECTION METHOD AND INSPECTION APPARATUS USING ELECTRON BEAM

(75) Inventors: Yasuhiro Gunji, Hitachiota (JP); Taku Ninomiya, Hitachinaka (JP); Ryuichi Funatsu, Hitachinaka (JP); Yoshikazu Inada, Hitachinaka (JP); Kenjirou Yamamoto, Matsudo (JP); Mari Nozoe, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 38 days.

(21) Appl. No.: 11/234,313

(22) Filed: Sep. 26, 2005

(65) Prior Publication Data

US 2006/0076490 A1    Apr. 13, 2006

Related U.S. Application Data

(63) Continuation of application No. 10/942,941, filed on Sep. 17, 2004, now abandoned, which is a continuation of application No. 10/464,761, filed on Jun. 19, 2003, now abandoned.

(30) Foreign Application Priority Data

Jun. 21, 2002    (JP) ............................. 2002-180735

(51) Int. Cl.
*G01R 31/302* (2006.01)
(52) U.S. Cl. ...................... 250/310; 324/750
(58) Field of Classification Search ................ 250/310; 324/750, 751
See application file for complete search history.

(56) References Cited

U.S. PATENT DOCUMENTS

| 5,578,921 | A | 11/1996 | Morrell |
| 6,232,787 | B1 | 5/2001 | Lo et al. |
| 6,509,750 | B1 | 1/2003 | Talbot et al. |
| 6,573,736 | B1 | 6/2003 | Lee et al. |
| 6,586,952 | B2 | 7/2003 | Nozoe et al. |
| 6,657,192 | B1 | 12/2003 | Kim et al. |
| 6,924,482 | B2 | 8/2005 | Nozoe et al. |
| 2003/0052781 | A1 | 3/2003 | Iwasawa et al. |
| 2003/0179007 | A1 | 9/2003 | Nozoe et al. |
| 2005/0250224 | A1 | 11/2005 | Nozoe et al. |

FOREIGN PATENT DOCUMENTS

| JP | 2001-357808 | 12/2001 |
| JP | 2002-009121 | 1/2002 |
| JP | 2002-124555 | 4/2002 |

*Primary Examiner*—Kiet T. Nguyen
(74) *Attorney, Agent, or Firm*—Dickstein Shapiro LLP

(57) ABSTRACT

An inspection method and an inspection apparatus using an electron beam enabling more detailed and quantitative evaluation at a high throughput level. The method comprises the steps of irradiating, based on previously prepared information concerning a defect position on the surface of a sample, the defect and its vicinity with an electron beam a plurality of times at predetermined intervals; detecting an electron signal secondarily generated from the sample surface by the electron beam; imaging an electron signal detected by the previously specified n-th or later electron beam irradiation; and measuring the resistance or a leakage amount of the defective portion of the sample surface in accordance with the degree of charge relaxation by monitoring the charge relaxation state of the sample surface based on the electron beam image information.

5 Claims, 6 Drawing Sheets

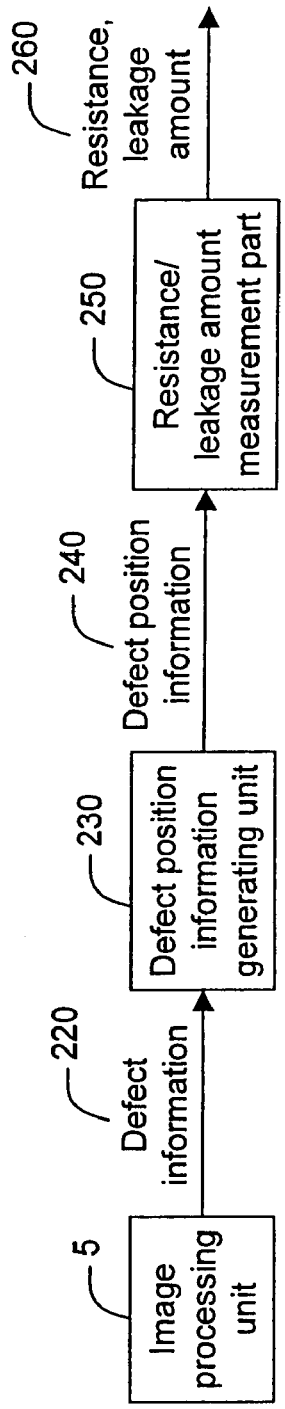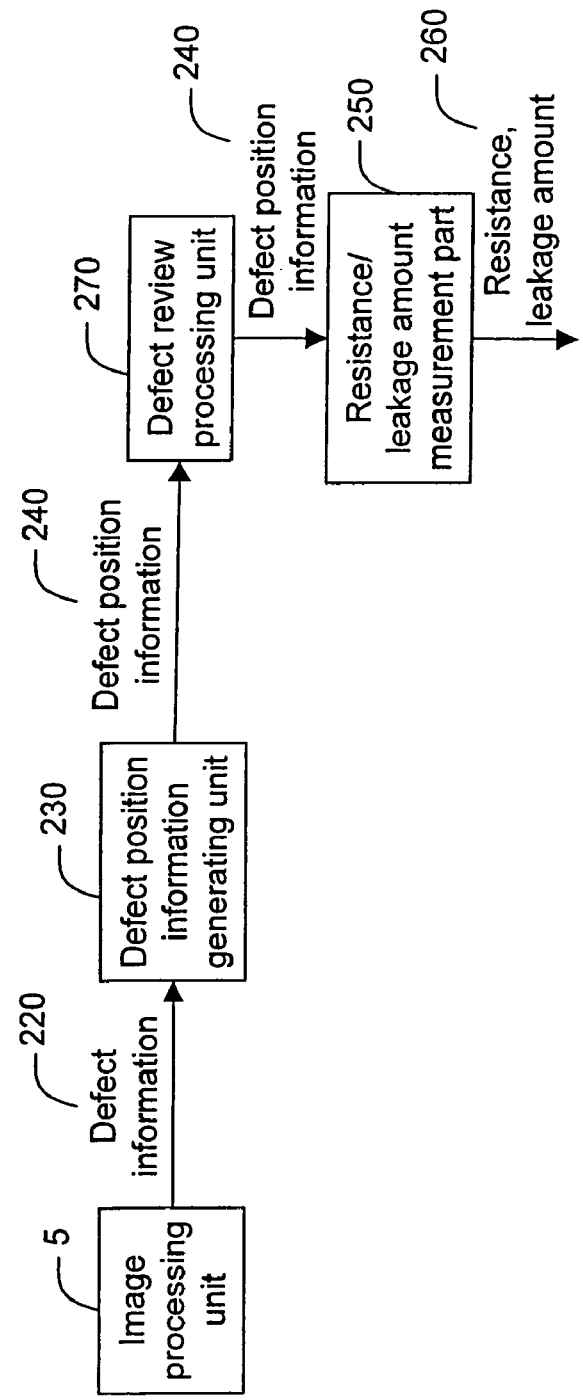

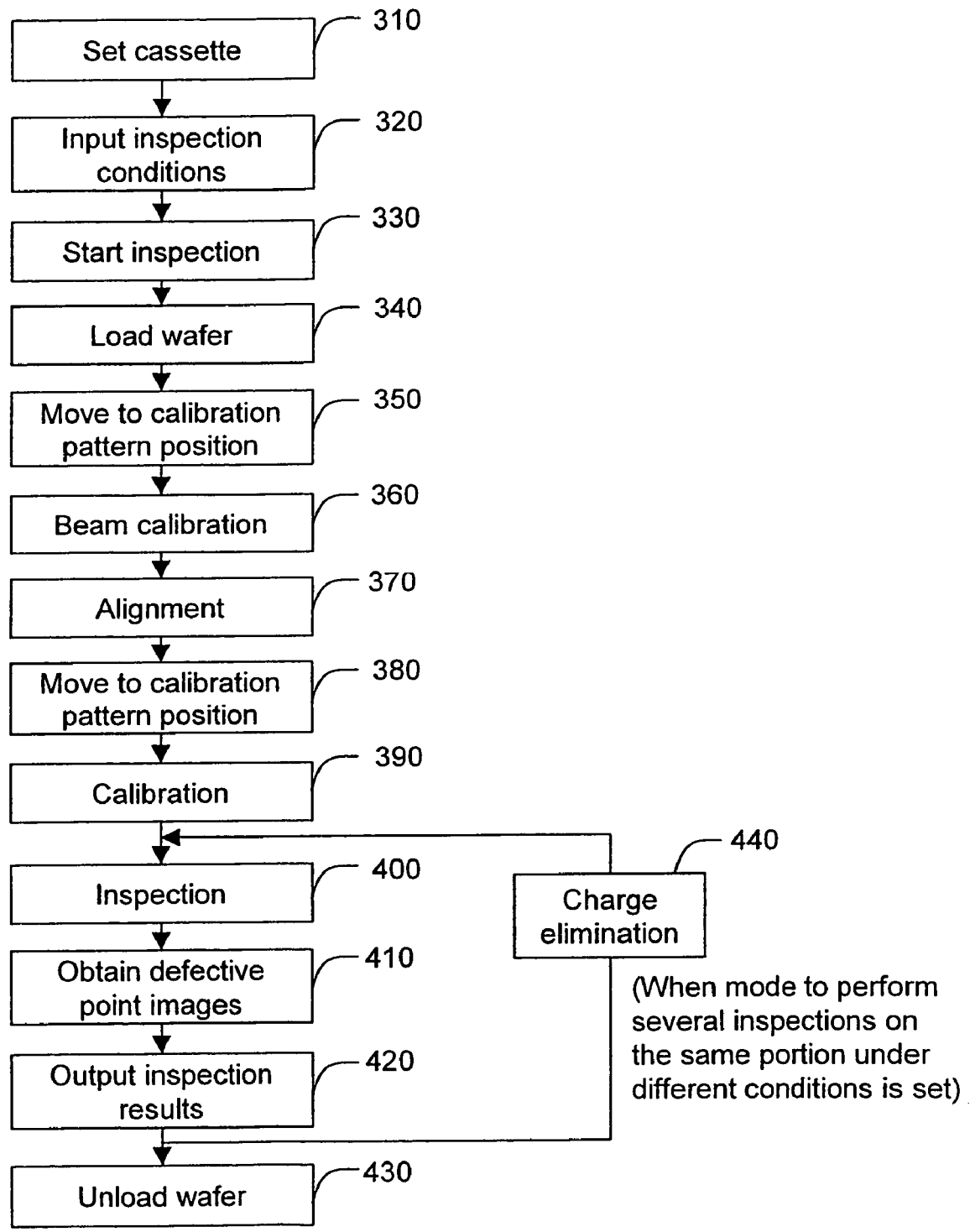

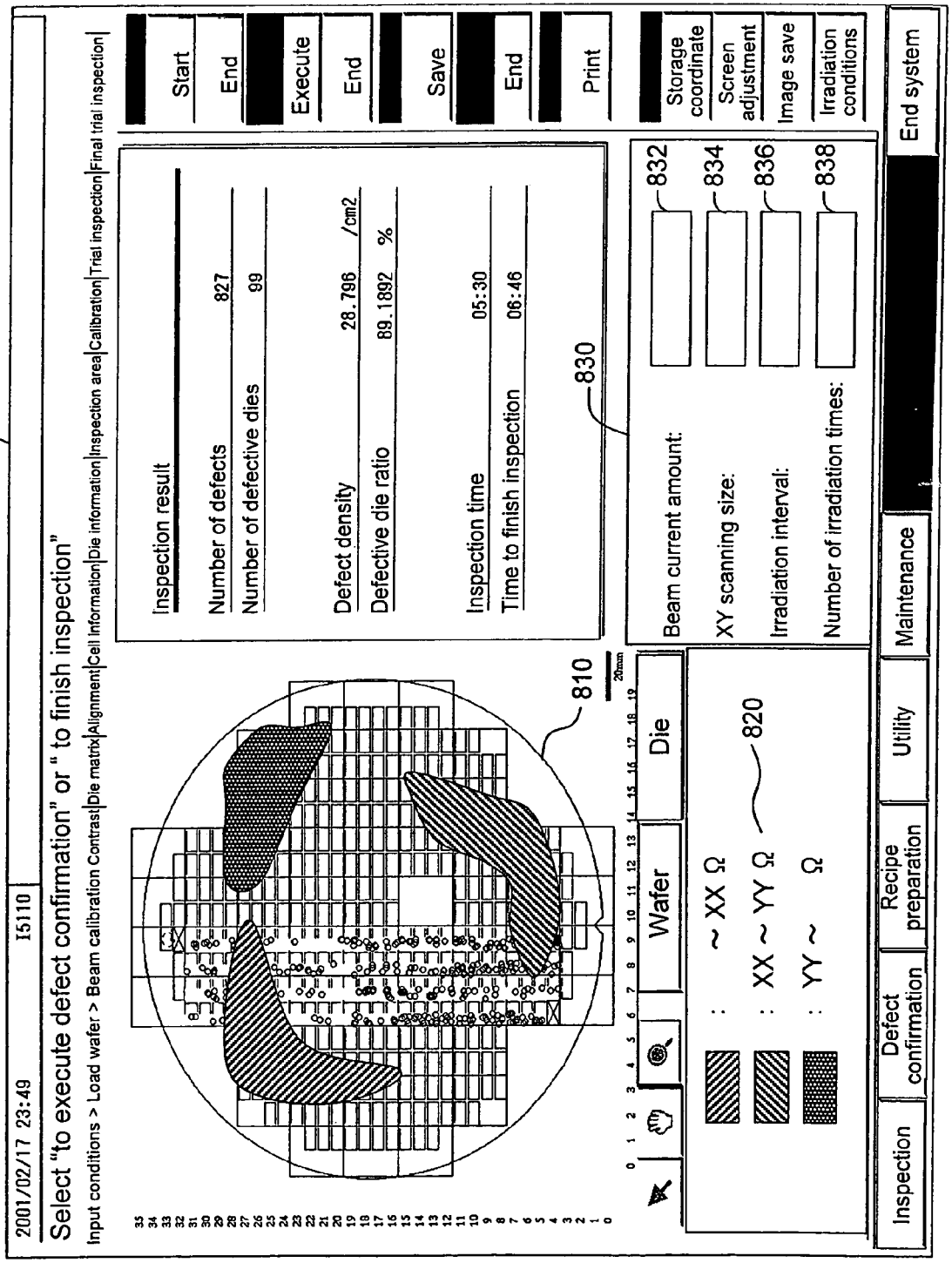

INSPECTION METHOD AND INSPECTION APPARATUS USING ELECTRON BEAM

CROSS-REFERENCE TO RELATED APPLICATIONS

This application is a continuation of U.S. patent application Ser. No. 10/942,941, filed on Sep. 17, 2004, now abandonded which in turn is a continuation of U.S. patent application Ser. No. 10/464,761, filed on Jun. 19, 2003 now abandonded. The subject matter of both applications are incorporated in their entirety by reference herein.

BACKGROUND OF THE INVENTION

1. Field of the Invention

The present invention relates to an inspection method and an inspection apparatus using an electron beam, both of which inspect a sample such as a semiconductor device having micro-fabricated patterns, a substrate, a photomask (a mask having patterns formed thereon, which is used for exposing patterns on a substrate), and a liquid crystal plate.

2. Description of the Related Art

Semiconductor devices such as memories and microcomputers used for computers, etc. are manufactured through the repetition of transcription processes such as exposing, lithographing, or etching patterns such as circuits, which are formed on photomasks. In the manufacturing process of semiconductor devices, the manufacturing yield is greatly affected by several factors. These include whether or not the results of the lithography process, etching process, or other processes involved are satisfactory. Yield is also affected by the presence or absence of foreign matter of the like. Therefore, in order to detect early or in advance the occurrence of abnormalities or defects, patterns on a semiconductor wafer are inspected at the end of each manufacturing process.

As one example of a method for inspecting defects present in a pattern on a semiconductor wafer, an optical visual inspection apparatus has been put into practice, wherein the comparison of patterns is performed using optical images obtained through light irradiation of a semiconductor wafer. However, as circuits have miniaturized (micro) patterns and complicated shapes, and as materials used for circuits have become diversified, it is difficult to detect these defects using optical images. Thus, a method and an apparatus for inspecting a pattern using an electron beam image that has higher resolution than an optical image have been put into practice.

Known are technologies disclosed, for example, in JP Patent Publication (Kokai) No. 59-192943, JP Patent Publication (Kokai) No. 5-258703, Sandland, et al., "An electron-beam inspection system for x-ray mask production," J. Vac. Sci. Tech. B, Vol. 9, No. 6, pp. 3005-3009 (1991), Meisburger, et al., "Requirements and performance of an electron-beam column designed for x-ray mask inspection," J. Vac. Sci. Tech. B, Vol. 9, No .6, pp. 3010-3014 (1991), Meisburger, et al., "Low-voltage electron-optical system for the high-speed inspection of integrated circuits," J. Vac. Sci. Tech. B, Vol. 10, No. 6, pp. 2804-2808 (1992), Hendricks, et al., "Characterization of a New Automated Electron-Beam Wafer Inspection System," and SPIE Vol. 2439, pp. 174-183 (Feb. 20-22, 1995).

In order to achieve high throughput and highly accurate inspections in line with the increase of wafer bore diameter and the miniaturization of circuit patterns, there is a need to obtain a high SN image at very high speeds. To this end, the number of electrons emitted through the use of a larger beam, with a current 1,000 times or more (100 nA or more) greater than that of an ordinary scanning electron microscope (hereinafter referred to as an SEM), should be preserved to ensure the maintenance of a high SN ratio. Further, it is essential to detect secondary electrons generated from a substrate and reflected electrons at high speeds and with high efficiency.

Furthermore, in order to prevent a semiconductor substrate with a insulating film such as a resist from being affected by charging, it is necessary to apply a low accelerated electron beam of 2 keV or less. This technology is disclosed in the "Electron/Ion beam handbook (2nd edition)," edited by the 132nd Committee of Japan Society for the Promotion of Science, pp. 622-623, Nikkan Kogyo Shimbun (1986). However, the use of the low accelerated electron beam with a large current generates aberrations due to the space charge effect, and thereby high-resolution observation has been difficult.

As a method for solving this problem, a technology wherein a highly accelerated electron beam is decelerated directly before a sample and is applied to the sample substantially as a low-speed accelerated electron beam is known. Such technology is disclosed in, for example, JP Patent Publication (Kokai) No. 2-142045 and JP Patent Publication (Kokai) No. 6-139985.

With respect to an inspection apparatus using the above SEM, the following problems have yet to be solved.

One problem is that detailed evaluation is impossible because the presence of defects is digitally judged as being 0 or 1, and during this period analog judgment cannot be performed. Taking a non-opening defect of a plug hole bottom as an example, this means that it is conventionally judged to be conductive or non-conductive, but in contrast there also exists an intermediate, semi-conductive state. However, a plug is originally required to permit low resistance and ohmic connections among levels of wirings. In view of this point, it can be said that a detailed analog evaluation should be conducted using the resistance.

Further, refresh defects of DRAMs, transistor leakage defects of flash memories, or the like, though they are categorized as the same type of electric characteristic defects, are caused by a micro leakage current of a pn junction, and these defects are difficult to detect even with an SEM inspection apparatus. JP Patent Publication (Kokai) No. 2002-9121 discloses attempts to detect the above defects by intermittently applying an electron beam in a condition where a junction is charged in a reverse biased state, and detecting the defect as an electric potential contrast image using a state where the charge is relaxed through a junction leakage current.

However, in this method, since the irradiation of the electron beam at the same location is repeated many times, it is necessary to move a wafer in a step-and-repeat manner. Therefore, when stationary time of a stage mechanism or time lost through stage control is taken into consideration, a problem arises, in which the throughput, evaluated in terms of the time required for one semiconductor substrate, deteriorates.

SUMMARY OF THE INVENTION

The present invention has been accomplished in view of the above points, and thus has an object of providing an inspection method and an inspection apparatus using an electron beam, which enables a high throughput of more detailed and quantitative evaluation, by using an SEM inspection apparatus as technology for inspecting characteristic electric defects that are difficult to detect through optical images and by making it possible not only to judge conductiveness or non-conductiveness, etc., but also to measure the resistance or a leakage current amount at a pn junction.

An embodiment of the present invention is an inspection apparatus using an electron microscope for detecting a defect on a pattern of a sample based on a detection signal of secondary charged particles generated by scanning an electron beam, wherein a rough inspection for narrowing down defect candidates is first conducted and defect review is performed, and then the resistance or leakage amount of a defective portion is measured.

More specifically, a method of the present invention comprises the steps of: irradiating, based on previously prepared information concerning a defect position on the surface of a sample, the defect and its vicinity with an electron beam a plurality of times at predetermined intervals; detecting an electron signal secondarily generated from the sample surface by the electron beam; imaging the electron signal detected by the previously specified n-th or later electron beam irradiation; and measuring the resistance or a leakage amount of a defective portion of the sample surface in accordance with the degree of charge relaxation by monitoring a charge relaxation state of the sample surface based on information of the electron beam image.

This specification includes part or all of the contents as disclosed in the specification and/or drawings of Japanese Patent Application No. 2002-180735, which is a priority document of the present application.

BRIEF DESCRIPTION OF THE DRAWINGS

FIGS. 2a and 2b are function block diagrams of an embodiment of the present invention.

FIG. 3 is a flow chart showing an inspection procedure.

FIG. 7 is a screen view showing an example display on a monitor.

DETAILED DESCRIPTION OF THE PREFERRED EMBODIMENTS

Preferred embodiments of the present invention will hereinafter be described with reference to the accompanying drawings.

Figure 1:
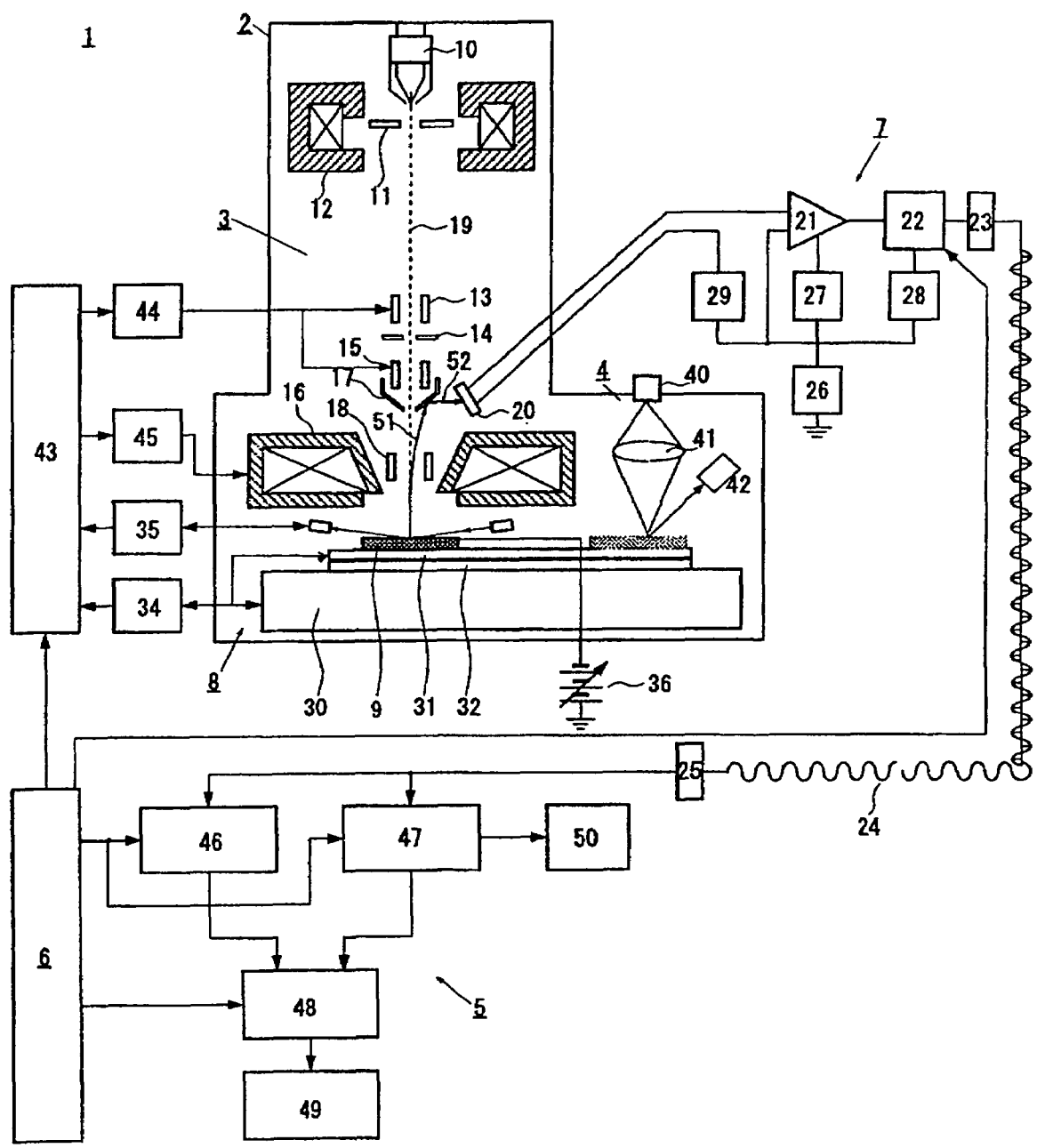
FIG. 1 is a vertical cross sectional view showing a configuration of a SEM type visual inspection apparatus.

FIG. 1 is a vertical cross sectional view illustrating a configuration of an SEM type visual inspection apparatus 1 as one example of an inspection apparatus using a scanning electron microscope to which the present invention is applied. The SEM type visual inspection apparatus 1 comprises an inspection chamber 2, the inside of which is evacuated, and a spare chamber (not shown in the present embodiment) for conveying a sample substrate 9 into the inspection chamber 2. These inspection chamber 2 and spare chamber are configured so that they are independently evacuated. In addition to the above inspection chamber 2 and spare chamber, the SEM type visual inspection apparatus 1 is composed of an image processing unit 5, a controller 6, and a secondary electrons detection unit 7.

The inside of the inspection chamber 2 is roughly divided into an electron optics system 3, a sample chamber 8, and an optical microscope unit 4. The electron optics system 3 comprises an electron gun 10, an electron-beam drawing electrode 11, a condenser lens 12, a blanking deflector 13, a scan deflector 15, a diaphragm 14, an objective lens 16, a reflecting plate 17, and an ExB deflector 18. A secondary electron detector 20 of the secondary electrons detection unit 7 is disposed above the objective lens 16 in the inspection chamber 2. An output signal of the secondary electron detector 20 is amplified by a preamplifier 21 provided outside the inspection chamber 2, which in turn is converted into digital data by an AD converter 22.

The sample chamber 8 comprises a sample table 30, an X stage 31, a Y stage 32, a position monitoring length-measuring device 34, and a sample substrate height measuring device 35. The optical microscope unit 4 is located in the vicinity of the electron optics system 3 lying within the inspection chamber 2 and is installed at a position where they are distant from each other to such an extent that they do not exert influence on each other. The distance between the electron optics system 3 and optical microscope unit 4 is known. Further, the X stage 31 or the Y stage 32 moves forward and backward alternately between the electron optics system 3 and the optical microscope unit 4. The optical microscope unit 4 comprises a light source 40, an optical lens 41, and a CCD camera 42.

The image processing unit 5 comprises a first image storage part 46, a second image storage part 47, an operation part 48, and a defect determination part 49. A captured electron-beam image or optical image is displayed on a monitor 50.

Operation instructions and operating conditions used for the respective parts of the apparatus are inputted to and outputted from the controller 6. Conditions such as accelerating voltage, deflected width and a deflection speed of an electron beam at the occurrence of the electron beam, timings for capturing signals by the secondary electrons detection unit 7, a sample table traveling speed, and others have been inputted in advance to the controller 6 so that they can be arbitrarily or selectively set depending on purposes. The controller 6 monitors shifts or displacements in position and height from signals outputted from the position monitoring length measuring device 34 and the sample substrate height measuring device 35 by the use of the correction control circuit 43. Based on the results of the monitoring, the controller 6 enables the correction control circuit 43 to generate a correction signal, and to send the correction signal to the objective lens source 45 and a scan signal generator 44, so that an electron beam is always applied to the proper position.

In order to obtain an image of the sample substrate 9, a thinly-focused electron beam 19 is applied to the sample substrate 9 to thereby produce secondary electrons 51. They are detected in synchrony with the scanning of the electron beam 19 and the movements of the X stage 31 and the Y stage 32, thereby obtaining the image of the sample substrate 9.

It is essential to enhance the inspection speed for the SEM type visual inspection apparatus. Therefore, unlike an ordinary conventional type of SEM, the SEM type visual inspection apparatus does not perform the scanning of an electron beam of an electron-beam current on the order of pA at low speeds, perform the scanning a large number of times, or perform the superimposition of respective images on one another. Further, for the purpose of restricting charging on an insulating material, it is necessary to scan the electron beam once or several times at high speed, rather than many times. Thus, in the present embodiment, an electron beam having a larger current of, for example, 100 nA, which is about 1,000 times or more greater than that of a conventional SEM, is scanned once alone to thereby form an image.

A diffusion refill-type thermofield emission electron source is used for an electron gun 10. The use of this electron gun 10 makes it possible to ensure an electron beam current remains stable as compared with, for example, a tungsten filament electron source and a cold field emission type electron source. Therefore, an electron beam image that shows little change in brightness can be obtained. Further, since the electron gun 10 enables the electron beam current to be set at a high level, the high-speed inspection described below can be realized. The electron beam 19 is drawn from the electron gun 10 by applying a voltage between the electron gun 10 and the drawing electrode 11.

The electron beam 19 is accelerated by applying a negative potential with a high voltage to the electron gun 10. This enables the electron beam 19 to move to the sample table 30 by means of energy equivalent to the potential, followed by convergence on the condenser lens 12. Further, the electron beam 19 is thinly-focused by the objective lens 16 to be applied to the sample substrate 9 mounted on the X stage 31 and the Y stage 32 placed on the sample table 30. The sample substrate 9 is a semiconductor wafer, a chip, or a substrate having a micro-fabricated circuit pattern such as a liquid crystal, a mask, or the like. The scan signal generator 44 for generating a scan signal and a blanking signal is connected to the blanking deflector 13, and the objective lens source 45 is connected to the objective lens 16.

To the sample substrate 9, negative voltage can be applied by a high-voltage power supply 36. By adjusting the voltage of this high-voltage power supply 36, the electron beam 19 is decelerated and electron beam irradiation energy applied to the sample substrate 9 can be adjusted to an optimum value without changing the potential of the electron gun 10.

The secondary electrons 51 generated by applying the electron beam 19 to the sample substrate 9 are accelerated under the negative voltage applied to the sample substrate 9. The E×B deflector 18 is disposed above the sample substrate 9. The deflector 18 is used for turning the orbit of secondary electrons by means of both electric and magnetic fields without affecting the orbit of the electron beam 19. This enables the accelerated secondary electrons 51 to be deflected in a predetermined direction. The intensities of the electric and magnetic fields applied to the E×B deflector 18 allow adjustments to the amount of deflection of secondary electrons. In addition, these electric and magnetic fields can be varied in conjunction with the negative voltage applied to the sample substrate 9.

The secondary electrons 51 deflected by E×B deflector 18 collide with the reflecting plate 17 under predetermined conditions. The reflecting plate 17 has a conical shape and also has a function as a shield pipe to shield the electron beam 19 applied to the sample substrate 9. When the accelerated secondary electrons 51 collide with this reflecting plate 17, second secondary electrons 52, having energy from a few eV to 50 eV, are produced from the reflecting plate 17.

The secondary electrons detection unit 7 has the secondary electron detector 20 provided within the evacuated inspection chamber 2. A preamplifier 21, an AD converter 22, an optical converting means 23, optical transmission means 24, an electric converting means 25, a high-voltage power supply 26, a preamplifier drive source 27, an AD converter drive source 28, and a reverse bias source 29 are provided outside the inspection chamber 2, which constitutes the secondary electrons detection unit 7.

The secondary electrons detector 20 of the secondary electrons detection unit 7 is placed above the objective lens 16 inside the inspection chamber 2. The secondary electrons detector 20, preamplifier 21, AD converter 22, optical converting means 23, preamplifier drive power source 27, and AD converter drive power source 28 are rendered floating at a positive potential by the high-voltage power supply 26. The second secondary electrons 52 generated from the collision of the secondary electrons 51 with the reflecting plate 17 are introduced into the secondary electrons detector 20 under the action of a drawing electric field created by the positive potential.

The secondary electrons detector 20 is configured so as to detect the second secondary electrons 52 generated by the collision of the secondary electrons 51 with the reflecting plate 17 in conjunction with the time when the electron beam 19 is scanned. An output signal of the secondary electrons detector 20 is amplified by the preamplifier 21 provided outside the inspection chamber 2, which in turn is converted into digital data by the AD converter 22.

The AD converter 22 is configured so as to convert an analog signal detected by the secondary electrons detector 20 into a digital signal immediately after the preamplifier 21 amplifies the signal, and then transmit the signal to the image processing unit 5. Since the detected analog signal is digitized and transmitted immediately after its detection, a signal having a higher speed and S/N ratio than a conventional signal can be obtained.

The sample substrate 9 is mounted on the X stage 31 and the Y stage 32. Either one of a method for stopping the X stage 31 and the Y stage 32 upon the execution of an inspection to thereby two-dimensionally scan the electron beam 19, and a method for sequentially moving the X stage 31 and the Y stage 32 in a Y direction at a constant speed upon the execution of the inspection to thereby linearly scan the electron beam 19 in an X direction can be selected. In the case of inspecting a relatively small specific given area, the former method of stopping the sample substrate 9 for inspection is effective. In the case of inspecting a relatively wide area, the method of consecutively moving the sample substrate 9 at a constant speed for inspection is effective. In addition, when blanking on the electron beam 19 is necessary, the electron beam 19 is deflected by the blanking deflector 13 so that the electron beam is controlled so as not to pass through the diaphragm 14.

In the present embodiment, a laser interference-based wavemeter is used as the position monitoring length-measuring device 34 for monitoring the positions of the X stage 31 and the Y stage 32. The positions of the X stage 31 and the Y stage 32 can be monitored in real time, and the results thereof are to be transferred to the controller 6. Further, the present embodiment is configured so that data items concerning the numbers of revolutions of motors used for the X stage 31, Y stage 32, etc. are also transferred from their drivers to the controller 6 in the same manner. The controller 6 is able to accurately grasp each area and position irradiated with the electron beam 19 based on these data items. Therefore, when a position irradiated with the electron beam 19 is deviated from an intended position, the correction control circuit 43 can correct the position in real time, if necessary. Further, areas irradiated with the electron beam 19 can be stored for every sample substrate 9.

The sample substrate height measuring device 35 utilizes an optical measuring instrument, e.g., a laser interference measuring instrument or a reflected-light type measuring instrument for measuring the position change of reflected light. It is configured so as to measure the height of the sample substrate 9 mounted on the X stage 31 and the Y stage 32 in real time. The present embodiment employs a method comprising the steps of applying a slender white light transmitted through a slit to the sample substrate 9 through a transparent window, detecting the position of the reflected light thereof by a position detecting monitor, and calculating the amount of height change from the variation in position. Based on data measured by this optical height measuring device 35, the focal distance of the objective lens 16 is dynamically corrected, whereby the electron beam 19 that is focused on each area to be inspected can be always applied. Further, warpage or height distortion of the sample substrate 9 is measured in advance before the application of the electron beam, and based on the data thereof, the objective lens 16 may also be configured so that correction conditions thereof are set for each inspected area.

The image processing unit 5 comprises a first image storage part 46, a second image storage part 47, an operation part 48, a defect determination part 49 and a monitor 50. An image signal on the sample substrate 9 detected by the secondary electrons detector 20 is amplified by the preamplifier 21 and digitized by the AD converter 22. Thereafter it is converted into a light signal by an optical converting means 23 and transmitted by an optical transmitting means 24. Then, it is converted again into an electric signal by an electric converting means 25, and the thus obtained signal is stored in the first or second image storage part 46 or 47. The operation part 48 performs an alignment between the image signal stored in the first image storage part 46 and the image signal stored in the second image storage part 47, standardization of signal level, and various image processes for removing noise signals. It also computes both the image signals for comparison. The defect determination part 49 compares the absolute value of the differential image signal computed for comparison by the operation part 48 with a predetermined threshold value. When the level of the differential image signal is larger than the predetermined threshold value, the defect determination part 49 judges their pixels as defect candidates, and their positions, the number of defects, etc. are displayed on the monitor 50.

Next, the operation of each part of the inspection apparatus shown in FIG. 1 will be described according to the inspection procedure shown in FIG. 3. FIG. 3 shows a flowchart of the inspection procedure.

First, a wafer cassette having a wafer placed on the desired shelf is placed on a cassette placement part of a wafer transportation system (Step 310 of FIG. 3).

Next, in order to specify the wafer to be inspected, the number of the cassette shelf having the wafer placed thereon is entered through an operation screen. Then, through the operation screen various inspection conditions are inputted (Step 320 of FIG. 3). The inspection condition parameters to be inputted include those involving electron beam current, electron beam irradiation energy, scanning speed and signal detection sampling clock, the area to be inspected, and various types of information regarding the wafer to be inspected. Further, the content concerning whether a plurality of wafers are to be automatically and continuously inspected one by one, whether one wafer is to be inspected continuously under different conditions, or the like are inputted as inspection condition parameters. These parameters can be individually inputted, but usually the combinations of the above various inspection condition parameters are stored in a database as inspection condition data files. Therefore, it is necessary to select and input one file among inspection condition data files. When the input of these conditions is completed (Step 320 of FIG. 3), the inspection starts (Step 330 of FIG. 3).

When automatic inspection starts, a predetermined wafer is first transported into the inspection apparatus. When wafers to be inspected have different diameters, or when wafers have different shapes falling between those of the orientation flat type and notch type, the wafer transportation system can deal with these cases by replacing one holder for placing a wafer with another in accordance with the sizes or shapes of wafers. The wafer to be inspected is transported from the wafer cassette onto the wafer holder by the wafer loader, which includes an arm and a preliminary vacuum chamber. The wafer is securely held and subjected to evacuation together with the holder inside the wafer loader, and then transported to the inspection chamber that has already been evacuated by the evacuation system (Step 340 of FIG. 3). When the wafer is loaded, electron beam irradiation conditions for each part are set by an electron optics system controller based on the above inputted inspection condition parameters.

Figure 6:
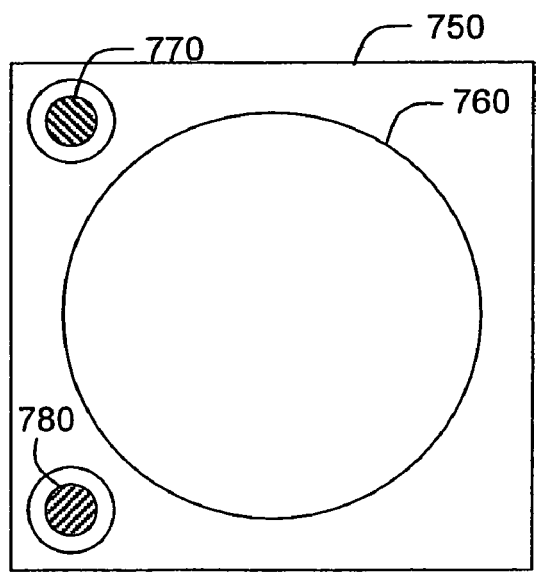
FIG. 6 is a plan view of a wafer holder.

FIG. 6 is a plane view of a wafer holder 750 on which a wafer 760 is placed. The wafer holder 750 as shown in FIG. 6 has a beam calibration pattern 770 placed thereon. A stage moves so that the beam calibration pattern comes beneath the electron optics system (Step 350 of FIG. 3), and an electron beam image of the beam calibration pattern 770 is obtained for making focal and astigmatic adjustments according to the obtained image. Then, the stage moves further so that the electron optics system is located above a specific point of the wafer to be inspected to obtain an electron beam image of the wafer and to adjust a contrast image or the like. At this time, when it is necessary to modify the electron beam irradiation conditions, etc., the parameters are modified and the beam calibration can be performed again. At the same time the height of the wafer is obtained by the height detector, a wafer height detection system computes the correlation between the height information and electron beam focusing conditions. Thereafter, whenever an electron beam image is obtained, an automatic adjustment of the focusing conditions is made based on the results of the wafer height detection, without the need for focusing each time. This enables electron beam images to be obtained continuously and at high speeds (Step 360 of FIG. 3).

When the input of the electron beam irradiation conditions and the focal/astigmatic adjustment are completed, alignment is performed in accordance with two points on the wafer (Step 370 of FIG. 3).

After the alignment is completed, the rotation or coordinate values are corrected based on the results of the alignment. Then, the stage moves so that the electron optics system is located above a second calibration pattern 780 placed on the wafer holder 750 as shown in FIG. 6 (Step 380 of FIG. 3). The second calibration pattern 780 is a transistor or a pattern corresponding to a transistor having a normal junction formed thereon in advance. Using that pattern, the brightness of a normal portion is calibrated. Based on the results of the calibration, the electron optics system is located above the wafer to obtain an image of a pattern point on the wafer and perform brightness adjustment: in other words, calibration (Step 390 of FIG. 3).

After the calibration is completed, the inspection is performed (Step 400 of FIG. 3). With respect to the inspection method, while the stage is continuously moved to conduct the inspection of specified areas, the image processing is carried out on a real-time basis and an image of a defect occurrence point is automatically stored (Step 410 of FIG.

3). Then, the inspection result is displayed on the monitor 50, and the data is outputted to the outside through a data conversion part (Step 420 of FIG. 3).

For inputting the inspection conditions (Step 320 of FIG. 3), when the condition is set wherein one point is inspected several times under different conditions, a charge elimination process is carried out on the area that has been once inspected (Step 440 of FIG. 3). Although a charge-elimination part is not shown in FIG. 1, the charge elimination process is carried out, for example, by the application of ultraviolet light.

Then, an inspection is carried out again under different electron beam irradiation conditions (Step 400 of FIG. 3). In this way, when the inspection is completed, the wafer is unloaded and the inspection is finished (Step 430 of FIG. 3).

FIG. 2 is a function block diagram showing an embodiment of the present invention. The inspection performed in accordance with the inspection procedure described above is regarded as a rough inspection. Based on the results of this rough inspection, defect candidates are narrowed down. Thereafter, detailed inspection as shown below is carried out.

Namely, the inspections performed and the output of results obtained at Steps 400, 410, and 420 of FIG. 3 are represented as defect information 220 outputted from the image processing unit 5 in FIGS. 2(a) and (b). Based on this defect information 220, defect position information 240 is generated by a defect position information generating unit 230. The stage is moved so as to bring a defect position indicated by the defect position information 240 underneath the electron optics system, and a resistance/leakage amount measuring unit 250 measures the resistance and a leakage amount 260 (detailed inspection).

Since the rough inspection of the entire wafer is conducted at high speed by continuously moving the stage to narrow down defect candidates, and then a detailed inspection is conducted, which takes more time, the entire inspection efficiency can be greatly improved.

In FIG. 2(b), the stage is moved based on the defect position information 240, and a defect is reviewed by a defect review processing unit 270. Thereafter, the resistance and leakage amount are measured. While doing this, defect candidates are further narrowed down by defect review, and the inspection efficiency can be further enhanced.

Figure 4:
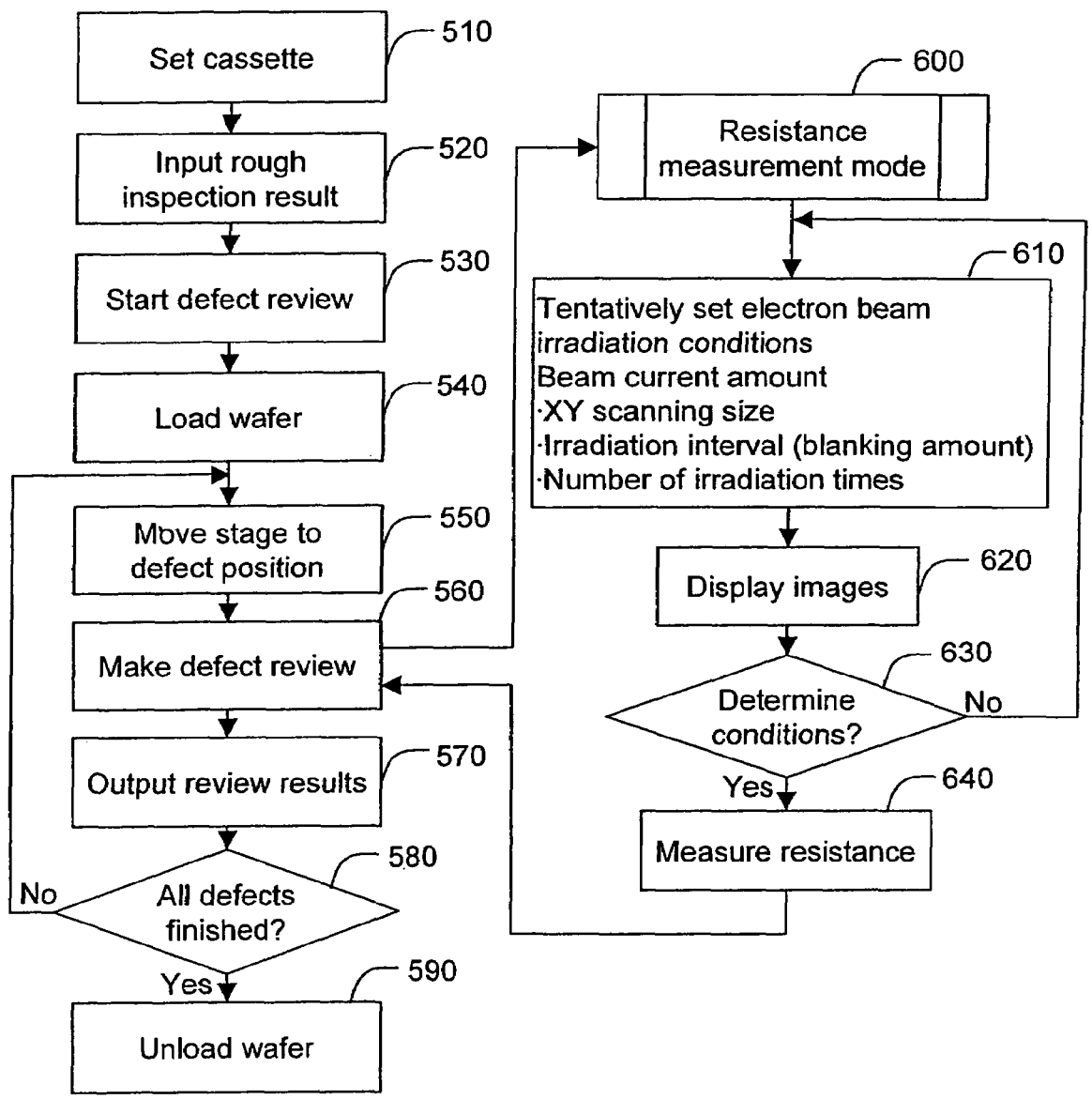
FIG. 4 is a flow chart showing an inspection procedure.

FIG. 4 is a flow chart showing an inspection procedure. With reference to FIG. 4, the inspection procedure shown in FIG. 2(b) is described in detail.

First, a wafer cassette having a wafer placed on a desired shelf is placed on a cassette placement part of a wafer transportation system (Step 510 of FIG. 4).

Next, in order to specify a wafer to be inspected, the number of the cassette shelf having the wafer placed thereon is entered through an operation screen. Then, through the operation screen the results of a rough inspection previously conducted are inputted (Step 520 of FIG. 4). The input contents include file names storing the inspection results.

When the input is completed, a defect review starts (Step 530). Once automatic defect review starts, first the predetermined wafer is transported into the inspection apparatus and then transported to an inspection chamber that has been already evacuated by the evacuation system (Step 540 of FIG. 4).

When the wafer is loaded, the stage is moved so as to bring a defect position underneath the electron optics system based on the defect position information as the above inputted results of the rough inspection (Step 550). The defect is displayed on the monitor 50 for reviewing (Step 560).

Thereafter, the process is shifted to a resistance measurement mode (Step 600).

Next, the electron beam irradiation condition is tentatively set at Step 610. Since the principle disclosed in JP Patent Publication (Kokai) No. 2002-9121 described above is used for measurement, an electron beam current amount, an XY scanning size, an irradiation interval, the number of irradiation times, etc. are tentatively set. At Step 620, an image corresponding to these conditions is displayed, and it is judged whether these conditions are suitable for measurement at Step 630. If the conditions are not suitable, the process returns to Step 610 to adjust the conditions. After suitable conditions are determined, the resistance of the defective portion is measured at Step 640.

Thereafter, the resistance measurement mode is finished, and the results of review, the results of resistance measurement, or the like are outputted at Step 570. With respect to subsequent defects, the same processes are repeated. Then, after the processes for all the defects are finished, the wafer is unloaded at Step 590 and then the process is finished.

Figure 5:
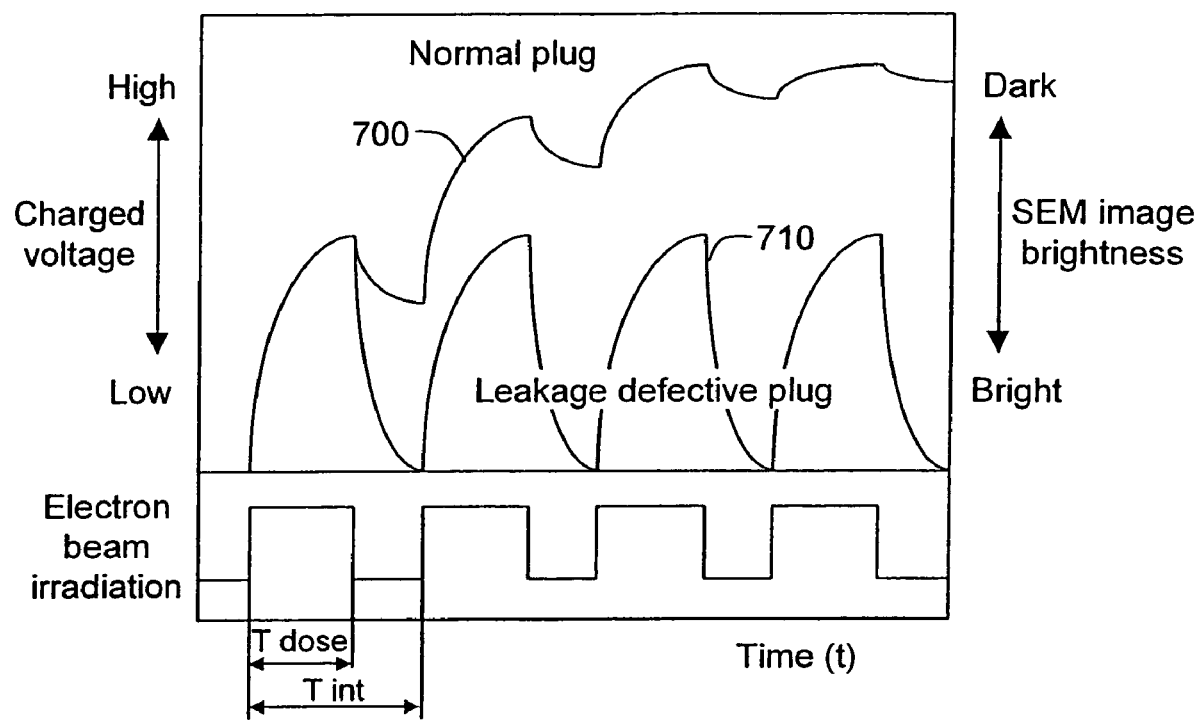
FIG. 5 is a relationship diagram illustrating a principle for measuring the resistance of a defective portion.

FIG. 5 is a relationship diagram illustrating a principle for measuring the resistance of a defective portion. The horizontal axis represents time, and the vertical axis represents the amount of electron beam irradiation and charged voltage, or SEM image brightness. The detailed principle of a method for resistance measurement of a defective portion is disclosed in JP Patent Publication (Kokai) No. 2002-9121. FIG. 5 shows an example plug having a shorter charge relaxation time than a plug having a pn junction with a normal electron beam irradiation interval $T_{int}$. In this case, after electron beam is applied a plurality of times, a difference between the normal plug 700 and leakage defect plug 710 in SEM image brightness occurs as shown in the figure. When the difference is classified quantitatively, the degree of leakage, namely the resistance component, can be estimated. For example, when the difference is larger, the resistance is estimated to be smaller.

FIG. 6 is a plane view of a wafer holder as mentioned above. Several types of leakage samples generated from a normal pn junction are prepared in the second calibration pattern 780 provided on the wafer holder 750, and these are compared with the SEM image brightness of each defective portion. This enables more accurate quantitative evaluation. By doing this, the estimation of absolute resistance can be achieved.

FIG. 7 is a screen view showing an example display on a monitor. The example display of FIG. 7 includes the measurement results concerning the resistance of defects. On left side of a screen 800, a wafer map 810 is displayed, and defects are indicated on the map by circular signs. Portions where leakage defects occur are indicated as a distribution pattern. In an area 820, legends for the distribution pattern of leakage defective portions as shown in the wafer map 810 are displayed, and in this example, the resistance is classified into three types. Each type may be distinguished by color to easily and visually identify them. In the figure, "XX" and "YY" practically represent specific values of the resistance. These values can be arbitrarily set. Further, the conditions at the time of measuring the resistance in this example are displayed in an area 830. An electron beam current amount, a scanning size in each direction of X or Y axis, an irradiation interval of the electron beam, and the number of times for electron beam irradiation on the same area are displayed in an area 832, an area 834, an area 836, and an area 838, of the area 830, respectively.

Defects such as leakage defects are greatly affected by process conditions, and therefore, for example, some defects are likely to occur around the wafer. According to this embodiment, such distribution characteristic can be more accurately grasped.

Although defects such as leakage defects are indicated on the distribution on the wafer in this embodiment, they may be indicated as a distribution on each chip of the wafer. In this case, the wafer map 810 as shown in FIG. 7 may display one chip or a plurality of chips.

The above embodiments according to the present invention are summarized as follows.

A method is provided, which comprises the steps of: irradiating, based on previously prepared information concerning a defect position on the surface of a sample, the defect and its vicinity with an electron beam a plurality of times at predetermined intervals; detecting an electron signal secondarily generated from the sample surface by the electron beam; imaging an electron signal detected by the previously specified n-th or later electron beam irradiation; and measuring the resistance or a leakage amount of a defective portion of the sample surface in accordance with the degree of charge relaxation by monitoring a charge relaxation state of the sample surface based on the electron beam image information.

The method may further comprise displaying image information obtained by the imaging step.

Further, the previously prepared defect position information is generated based on defect inspection by continuously moving a sample stage having a wafer placed thereon. The electron beam irradiation step, electron signal detection step, and resistance/leakage amount measurement step are repeated in a state where the sample stage is moved sequentially and stopped at each defect position based on the defect position information.

Furthermore, the resistance or leakage amount of each defective portion obtained in the resistance/leakage amount measurement step is displayed as in a map on a schematic diagram of the wafer organized by type of defect.

Moreover, a method is provided comprising the steps of: scanning an electron beam on a wafer while continuously moving a sample table having the wafer placed thereon; detecting an electron signal secondarily generated from the wafer surface by the electron beam; imaging the electron signal; specifying a defective portion by comparing electron beam images having the same pattern with each other; generating defect position information containing at least position information among attribution information of the defective portion; irradiating the defect and its vicinity with the electron beam a plurality of times at predetermined intervals based on the defect position information; detecting an electron signal secondarily generated from the wafer surface by the electron beam; imaging an electron signal detected by the pre-specified n-th or later electron beam irradiation; and measuring the resistance or a leakage amount of the defective portion on the wafer surface depending on the degree of charge relaxation by monitoring a charge relaxation state on the wafer surface in accordance with the electron beam image information.

In addition, an inspection apparatus is provided, which comprises a sample table for wafer placement; a stage mechanism unit for continuously moving the sample table; an electron source; an electron optics system for applying and scanning an electron beam from the electron source on the wafer; a detector for detecting an electron signal secondarily generated from the wafer surface by the electron beam; an image processing unit for imaging the electron signal and specifying a defective portion by comparing electron beam images having the same pattern with each other; and a defect position information generating unit for generating defect position information including at least position information among attribute information of a defective position. Here, the electron optics system has a function to irradiate, based on the defect position information, a defect and its vicinity with the electron beam at predetermined intervals a plurality of times. The detector detects the electron signal secondarily generated from the wafer surface by the electron beam, and the image processing unit has a function to image the electron signal detected by the pre-specified n-th or later electron beam irradiation. The apparatus further comprises a resistance/leakage amount measurement part for measuring the resistance or a leakage amount of the defective portion on the wafer surface depending on the degree of charge relaxation by monitoring the charge relaxation state of the wafer surface according to the electron beam image information.

As described above, it is possible to obtain an inspection method and an inspection apparatus enabling more detailed and quantitative evaluation at a high throughput level, by using an SEM type inspection apparatus as a technology for inspecting electric characteristic defects that are difficult to be detected by optical images, and making it possible not only to judge conductiveness or non-conductiveness but also to measure the resistance or a leakage current amount at a pn junction.

EFFECT OF THE INVENTION

As mentioned above, the present invention provides an inspection method and an inspection apparatus using an electron beam, which enables more detailed and quantitative evaluation at a high throughput level.

All publications, patents and patent applications cited herein are incorporated herein by reference in their entirety.

What is claimed is:

1. An inspection method using an electron beam comprising the steps of:

irradiating, based on previously prepared information concerning a defect position on the surface of a sample, the defect and its vicinity with an electron beam a plurality of times at predetermined intervals;

detecting an electron signal secondarily generated from the sample surface by the electron beam;

imaging the electron signal detected by the pre-specified n-th or later electron beam irradiation; and measuring the resistance or a leakage amount of a defective portion of the sample surface in accordance with the degree of charge relaxation by monitoring a charge relaxation state of the sample surface based on the electron beam image information;

wherein the previously prepared defect position information is generated based on defect inspection by continuously moving a sample stage having the sample placed thereon, and the electron beam irradiation step, electron signal detection step, and resistance/leakage amount measurement step are repeated in a state where the sample stage is moved sequentially and stopped at each defect position based on the defect position information whereby a plurality of small fields of patterns are captured in a large second field.

2. The inspection method according to claim 1, wherein the method comprises displaying image information obtained by the imaging step.

3. The inspection method according to claim 1, wherein the resistance or leakage amount of each defective portion obtained in the resistance/leakage amount measurement step is displayed as in a map on a schematic diagram of the sample organized by type of defect.

4. An inspection method using an electron beam comprising the steps of: scanning an electron beam on a sample while continuously moving a sample table having the sample placed thereon; detecting an electron signal secondarily generated from the sample surface by the electron beam; imaging the electron signal; specifying a defective portion by comparing electron beam images having the same pattern with each other; generating defect position information containing at least position information among attribution information of the defective portion; irradiating the defect and its vicinity with the electron beam a plurality of times at predetermined intervals based on the defect position information; detecting an electron signal secondarily generated from the sample surface by the electron beam; imaging an electron signal detected by pre-specified n-th or later electron beam irradiation; and measuring the resistance or a leakage amount of the defective portion on the sample surface depending on the degree of charge relaxation by monitoring the charge relaxation state on the sample surface in accordance with the electron beam image information whereby a plurality of small fields of patterns are captured in a large second field.

5. An inspection apparatus using an electron beam comprising: a sample table for sample placement; a stage mechanism unit for continuously moving the sample table; an electron source; an electron optics system for applying and scanning an electron beam from the electron source on the sample; a detector for detecting an electron signal secondarily generated from the sample surface by the electron beam; an image processing unit for imaging the electron signal and specifying a defective portion by comparing electron beam images having substantially the same pattern with each other; and a defect position information generating unit for generating defect position information including at least position information among attribute information of the defective position, wherein the electron optics system has further a function to irradiate, based on the defect position information, a defect and its vicinity with the electron beam at predetermined intervals a plurality of times, the detector detects the electron signal secondarily generated from the sample surface by the electron beam, the image processing unit has a function to image the electron signal detected by the pre-specified n-th or later electron beam irradiation, and the inspection apparatus further comprises a resistance/leakage amount measurement part for monitoring the charge relaxation state of the sample surface according to the electron beam image information and measuring the resistance or a leakage amount of the defective portion on the sample surface depending on the degree of charge relaxation whereby a plurality of small fields of patterns are captured in a large second field.

* * * * *